US012808691B2

(12) United States Patent
Ali et al.

(10) Patent No.: US 12,808,691 B2
(45) Date of Patent: Nov. 24, 2026

(54) TARGET PITCH-INDEPENDENT QUADRATURE MAGNETIC ENCODER

(71) Applicant: Allegro MicroSystems, LLC, Manchester, NH (US)

(72) Inventors: Syed Bilal Ali, Heidelberg (DE); Cédric Gillet, Annecy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 252 days.

(21) Appl. No.: 18/362,357

(22) Filed: Jul. 31, 2023

(65) Prior Publication Data

US 2025/0044382 A1 Feb. 6, 2025

(51) Int. Cl.

*G01D 5/14* (2006.01)
*G01D 5/244* (2006.01)
*G01D 5/245* (2006.01)
*G01D 5/247* (2006.01)
*G01D 5/249* (2006.01)
*G01R 33/07* (2006.01)

(52) U.S. Cl.

CPC ........... *G01D 5/145* (2013.01); *G01D 5/2448* (2013.01); *G01D 5/247* (2013.01); *G01D 5/2451* (2013.01); *G01D 5/2497* (2013.01); *G01R 33/072* (2013.01)

(58) Field of Classification Search

CPC ...... G01D 5/145; G01D 5/2053; G01D 5/244; G01D 5/24476; G01D 5/2448; G01D 5/2449; G01D 5/24495; G01D 5/2451; G01D 5/247; G01D 5/2497; G01D 18/001; G01D 18/008; G01R 33/072

See application file for complete search history.

(56) References Cited

U.S. PATENT DOCUMENTS 5,880,541 A * 3/1999 Hinds .................. G01D 5/2451 310/12.19
6,188,341 B1 * 2/2001 Taniguchi ............ G01D 18/001 341/111
7,102,317 B2 * 9/2006 Chun .................. G01D 5/2451 318/560
9,281,936 B2 * 3/2016 Kamatani ............ H04L 7/0054

(Continued)

OTHER PUBLICATIONS

U.S. Appl. No. 17/651,265, filed Feb. 16, 2022, Ostermann et al.

(Continued)

*Primary Examiner* — Steven L Yeninas

(74) *Attorney, Agent, or Firm* — Daly, Crowley, Mofford & Durkee, LLP

(57) ABSTRACT

According to one aspect of the disclosure, a method includes: receiving, by a magnetic field sensor, first and second magnetic field signals responsive to motion of a target; generating first and second digital pulse signals responsive to the first and second magnetic field signals, respectively; calculating a first time between a pulse edge of the first digital pulse signal and a next pulse edge of the second digital pulse signal; calculating a second time between two different pulse edges of the first digital pulse signal or two different pulse edges of the second digital pulse signal; calculating, using the calculated first and second times, a phase shift between the first and second magnetic field signals; and generating, using the calculated phase shift, a third magnetic field signal having a predetermined phase shift from the first magnetic field signal or from the first magnetic field signal.

24 Claims, 9 Drawing Sheets

(56) References Cited

U.S. PATENT DOCUMENTS

| | | | | |
|---|---|---|---|---|
| 9,438,147 | B2 * | 9/2016 | Ariga | G01D 5/2448 |
| 10,578,679 | B2 | 3/2020 | Sitorus et al. | |
| 10,598,739 | B2 | 3/2020 | Shoemaker et al. | |
| 10,816,366 | B2 * | 10/2020 | Weiland | G01D 5/2452 |
| 10,866,118 | B2 | 12/2020 | Foletto et al. | |
| 10,866,122 | B2 | 12/2020 | Weiland et al. | |
| 10,908,229 | B2 * | 2/2021 | Richards | G01R 33/072 |
| 11,333,530 | B2 | 5/2022 | Foletto | |
| 11,346,688 | B2 | 5/2022 | Stewert | |
| 11,480,630 | B2 | 10/2022 | Deligiannis et al. | |
| 2009/0115408 | A1 * | 5/2009 | West | G01D 5/2449 324/207.25 |
| 2010/0091926 | A1 * | 4/2010 | Kishibe | G01D 5/2448 375/371 |
| 2017/0343384 | A1 * | 11/2017 | Nakazato | G01D 5/244 |
| 2018/0136015 | A1 * | 5/2018 | Von Berg | G01D 18/00 |
| 2020/0080867 | A1 * | 3/2020 | Foletto | G01D 5/16 |
| 2020/0081073 | A1 * | 3/2020 | Richards | G01R 33/0029 |
| 2022/0290968 | A1 * | 9/2022 | Kling | G01D 5/145 |
| 2022/0291304 | A1 | 9/2022 | Richards | |
| 2022/0317142 | A1 | 10/2022 | Bastien et al. | |

OTHER PUBLICATIONS

U.S. Appl. No. 17/659,224, filed Apr. 14, 2022, Casu et al.

U.S. Appl. No. 17/809,382, filed Jun. 28, 2022, Latham et al.

"High-Resolution GMR Wheel Speed and Distance Sensor IC", Data Sheet A19360; Allegro MicroSystems, LLC; Dec 6, 2022 (18 pages).

"Magnetic Encoder Design for Electrical Motor Driving Using ATS605LSG", Application Information, 296134-AN, Rev. 2; Allegro MicroSystems, LLC; Oct. 25, 2019 (8 pages).

* cited by examiner

804

| Angle [degrees] | 802a | 802b | 802c | 802d | 802e | 802f | 802g | ••• |
|---|---|---|---|---|---|---|---|---|
| 0.00 | 0 | 0 | 0 | 0 | 0 | | | |
| 11.25 | 0 | 0 | 0 | 0 | 1 | | | |
| 22.50 | 0 | 0 | 0 | 1 | 0 | | | |
| 33.75 | 0 | 0 | 0 | 1 | 1 | | | |
| 45.00 | 0 | 0 | 1 | 0 | 0 | | | |
| 56.25 | 0 | 0 | 1 | 0 | 1 | | | |
| 67.50 | 0 | 0 | 1 | 1 | 0 | | | |
| 78.75 | 0 | 0 | 1 | 1 | 1 | | | |
| 90.00 | 0 | 1 | 0 | 0 | 0 | | | |
| • | • | • | • | • | • | | | |
| • | • | • | • | • | • | | | |
| • | • | • | • | • | • | | | |
| 315.00 | 1 | 1 | 1 | 0 | 0 | | | |
| 326.25 | 1 | 1 | 1 | 0 | 1 | | | |
| 337.50 | 1 | 1 | 1 | 1 | 0 | | | |
| 348.75 | 1 | 1 | 1 | 1 | 1 | | | |

TARGET PITCH-INDEPENDENT QUADRATURE MAGNETIC ENCODER

BACKGROUND

A magnetic encoder can include a magnetic target and a sensor configured to detect and output position information (e.g., absolute angular position) of the target based on changes of the target's magnetic field. In some cases, the target may be a gear having a plurality of magnetic (e.g., ferromagnetic) teeth. The distance between identical points on two adjacent gear teeth is referred as the target's "pitch." Magnetic encoders are used in electric motor control systems to synchronize the excitation signals, among other applications.

Some magnetic field sensors, such as used in magnetic encoders, include multiple magnetic field sensing elements (e.g., Hall elements) and corresponding front-end circuitry arranged in multiple channels. Each channel may produce a signal and the multiple signals can be processed together to detect and output the target position information.

SUMMARY

A two-channel magnetic encoder may require—in terms of achieving a desired accuracy, sensitivity, or other performance characteristic—the processing of two signals both having a 50% duty cycle and with 90° phase shift (sometimes referred to as "phase separation" or "phase offset") between the signals. That is, the signals being processed should be in quadrature or orthogonal. If these requirements are not met, the encoder may output inaccurate target position information.

With conventional magnetic encoders, the actual phase shift between the signals being processed may depend in significant part on the design of the target (e.g., target pitch), position of magnetic field sensing elements with respect to each other (e.g., spacing between elements) and with respect to the target (e.g., air gap). Thus, the accuracy of conventional encoders may depend in significant part on tolerances during manufacture and assembly.

Disclosed herein are systems and methods to achieve desirable phase shift between two or more magnetic field signals independent of the target design and sensing element spacing.

According to one aspect of the disclosure, a method includes: receiving, by a magnetic field sensor, first and second magnetic field signals responsive to motion of a target; generating first and second digital pulse signals responsive to the first and second magnetic field signals, respectively; calculating a first time between a pulse edge of the first digital pulse signal and a next pulse edge of the second digital pulse signal; calculating a second time between two different pulse edges of the first digital pulse signal or two different pulse edges of the second digital pulse signal; calculating, using the calculated first and second times, a phase shift between the first and second magnetic field signals; and generating, using the calculated phase shift, a third magnetic field signal having a predetermined phase shift from the first magnetic field signal or from the first magnetic field signal.

In some embodiments, the calculating of the first time can include calculating a time between a rising pulse edge of the first digital pulse signal and a next rising pulse edge of the second digital pulse signal. In some embodiments, the calculating of the second time can include calculating a time between consecutive rising pulse edges of the first digital pulse signal or consecutive rising pulse edges of the second digital pulse signal. In some embodiments, the calculating of the phase shift can include dividing the first time by the second time.

In some embodiments, the method can further include generating a third digital pulse signal responsive to the third magnetic field signal. In some embodiments, the method may further include: providing the first digital pulse signal on a first output of the sensor; and selectively providing either the second or third digital pulse signal on a second output of the sensor.

In some embodiments, the method can further include detecting the motion of the target to be a constant motion, wherein the calculating of the phase shift is performed in response to the detecting of the constant motion. In some embodiments, the method can further include: storing, during a first period of operation, the calculated phase shift to a memory of the magnetic field sensor; retrieving, during a second period of operation, the stored phase shift from the memory; and using the retrieved phase shift to generate the third magnetic field signal.

In some embodiments, the predetermined phase shift may be ninety degrees. In some embodiments, the first magnetic field signal can be generated by at least one or more magnetic field sensing elements of the magnetic field sensor and the second magnetic field signal is generated by at least one or more other magnetic field sensing elements of the magnetic field sensor. In some embodiments, the first and second magnetic field sensing elements may comprise Hall effect elements.

In some embodiments, the method may further include: generating, using calculated phase shift, one or more other magnetic field signals having respective other predetermine phase shifts from first magnetic field signal. In some embodiments, the target can comprise a multiple-ring absolute encoder.

According to another aspect of the disclosure, a magnetic field sensor includes: a plurality of magnetic field sensing elements configured to generate first and second magnetic field signals responsive to motion of a target and circuitry configured to perform any embodiments of the method just described.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

BRIEF DESCRIPTION OF THE DRAWINGS

The manner of making and using the disclosed subject matter may be appreciated by reference to the detailed description in connection with the drawings, in which like reference numerals identify like elements.

Figure 1:
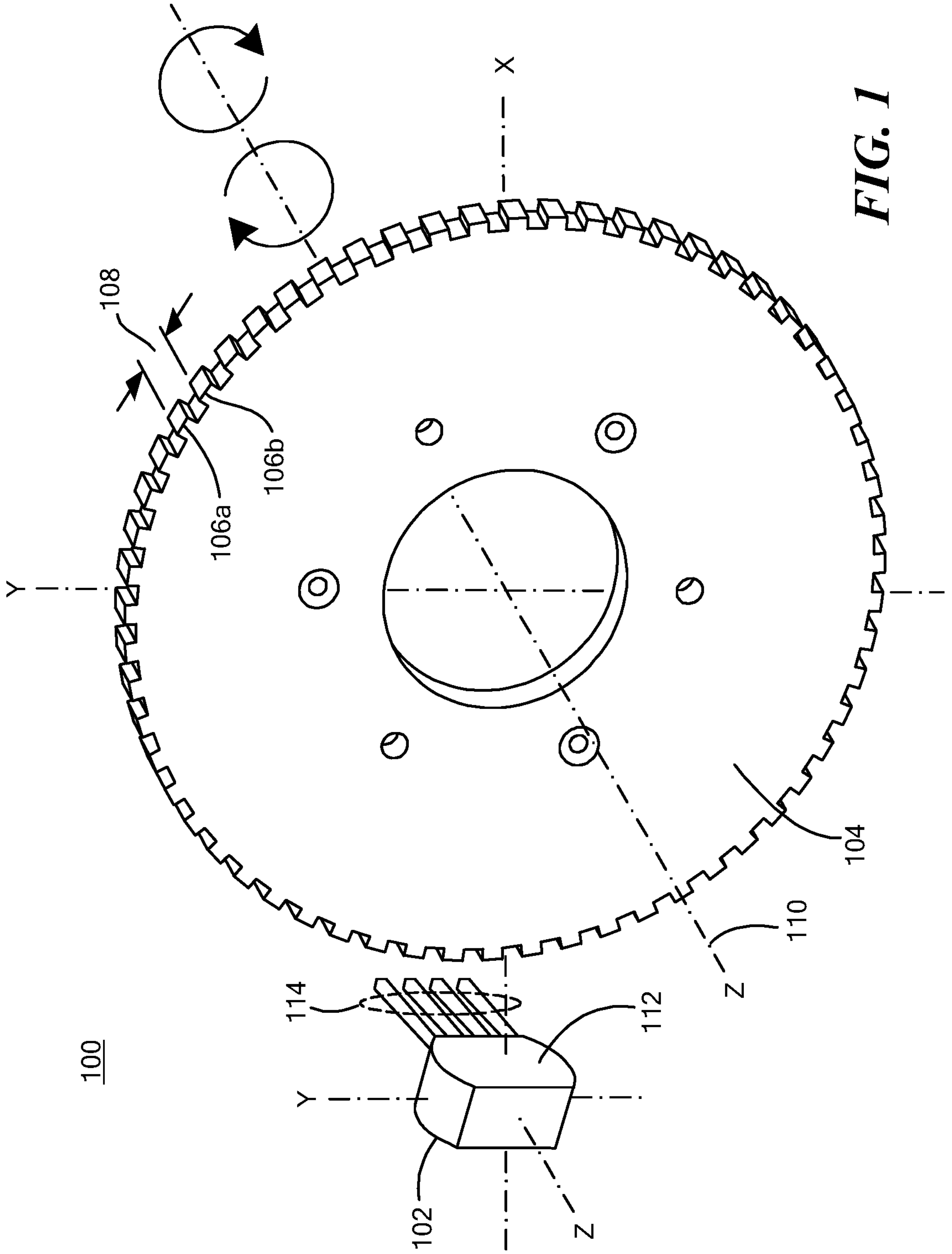
FIG. 1 is perspective view of a magnetic encoder, according to some embodiments.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Turning to FIG. 1, a magnetic encoder 100 can include a magnetic field sensor 102 positioned near a target 104. In this example, target 104 is shown as a gear having a plurality of teeth 106*a*, 106*b*, etc. (106 generally) with pitch 108. To promote clarity in the drawing, only two teeth 106, 106*b* are labeled. Gear teeth 106 may be comprised of a magnetic material (e.g., ferromagnetic material) such that rotation of the target 104 produces a change in magnetic field density, allowing sensor 102 to detect the approach of individual gear teeth 106. In some cases, sensor 102 may include or otherwise be used in combination with a back-biased magnet (e.g., a rare earth permanent magnet) such that when an individual gear tooth approaches a magnet, it distorts the field surrounding that magnet, allowing for detection by sensor 102.

Magnetic field sensor 102 may comprise a plurality of magnetic field sensing elements to generate one or more signals ("magnetic field signals") responsive to the target 104 (e.g., responsive to its rotation) and circuitry configured to process the magnetic field signals to detect and output information about the target's position. In some embodiments, sensor 102 may output two or more pulse signals encoding target position information.

As shown, target 104 may rotate around an axis 110 (Z axis) and sensor 102 may be positioned alongside the target 104 with surface (or "face") 112 lying substantially in the Y-Z plane and intersecting the X axis. In this arraignment, the magnetic field sensing elements (e.g., planar Hall elements) may be arranged to have axes of sensitivity perpendicular to sensor surface 112, allowing the approach of gear teeth 106 to be sensed.

In some cases, two or more magnetic field sensing elements within sensor 102 can be spaced apart (e.g., along the Y axis in FIG. 1) such that the generated magnetic field signals are phase-shifted. In the case of a two-channel sensor, orthogonal magnetic field signals may be desired, however the actual phase shift may be more than or less than 90° depending on target pitch and spacing between sensing elements, for example. In some embodiments, sensor 102 can be configured to generate, from the magnetic field signals, one or more phase-corrected (or "virtual channel") signals that have predetermined, desired phase shift with respect to at least one of the magnetic field signals. The virtual channel signal(s) can be used to accurately detect target position information, as discussed further below with FIG. 2.

In some embodiments, the magnetic field sensing elements and/or the sensor circuitry may be provided on one or more integrated circuits (ICs). As shown, magnetic field sensor 102 may be provided as a 4-pin system in a package (SIP), with at least one of the pins 114 providing an output signal encoding the position information of target 104.

Magnetic encoder 100 can be employed in various types of applications. For example, used in an electric motor control system, target 104 may be coupled to the rotor and the output of magnetic field sensor 102 may be used to synchronize a motor excitation signal.

Figure 2:
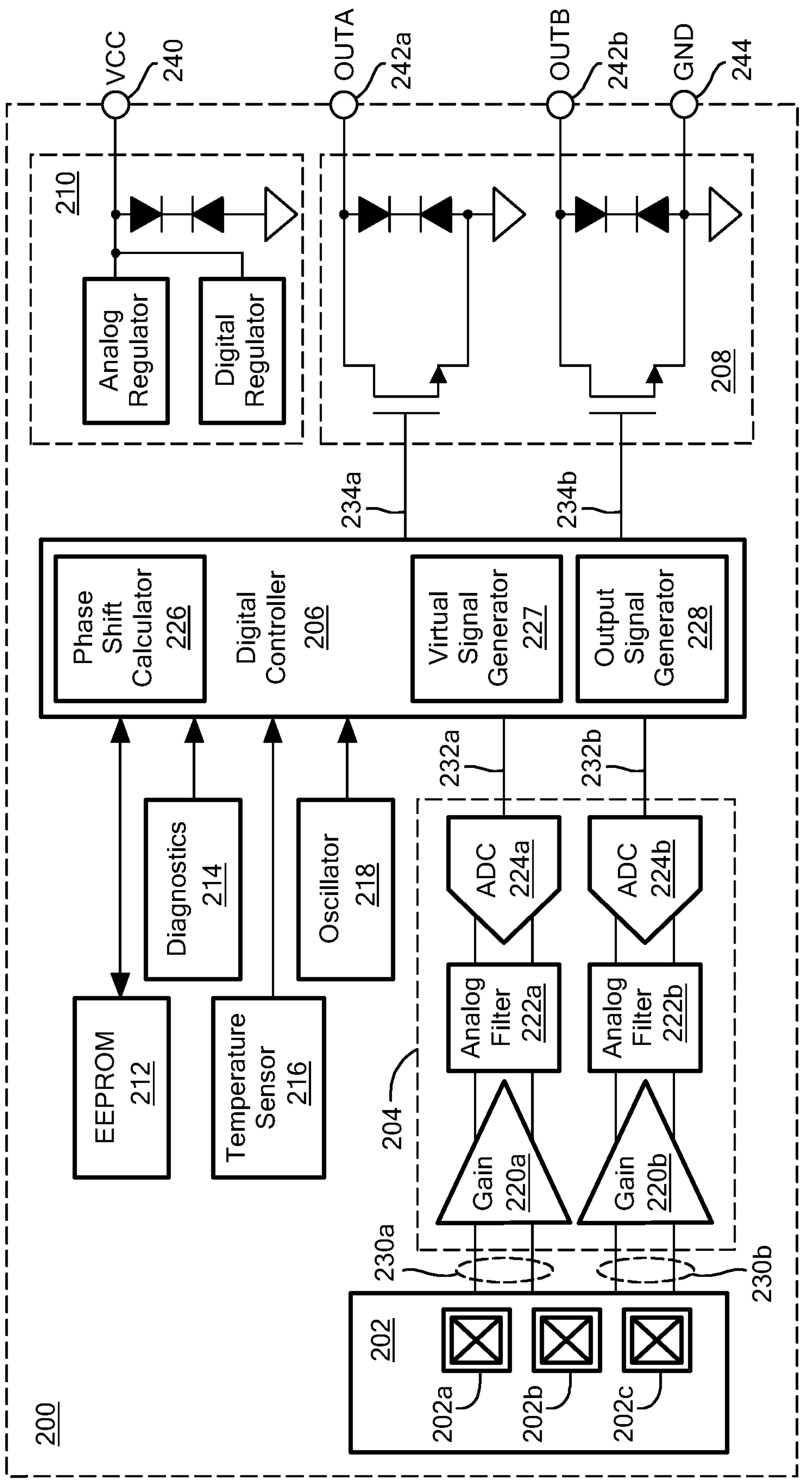
FIG. 2 is circuit diagram showing an example two-channel magnetic field sensor with automatic phase correction that may be provided within a magnetic encoder, according to some embodiments.

FIG. 2 is circuit diagram showing an example two-channel magnetic field sensor with automatic phase correction, according to some embodiments. Illustrative magnetic field sensor 200—which may be provided within magnetic encoder 100 of FIG. 1, for example—includes magnetic field sensing elements 202 connected to front-end circuitry 204, a digital controller 206, output driver circuitry 208, and supply regulation circuitry 210. In the embodiment shown, sensor 200 may also include electrically erasable programmable read-only memory (EEPROM) 212, diagnostic circuitry 214, a temperature sensor 216, and an oscillator 218. Sensing elements 202 can include a plurality of sensing elements (e.g., planar Hall elements), with three sensing elements 202*a*, 202*b*, 202*c* shown in the example of FIG. 2. Front-end circuitry 204 can include: a first channel having a first amplifier 220*a*, a first analog filter 222*a*, and a first analog-to-digital converter (ADC) 224*a*; and a second channel having a second amplifier 220*b*, a second analog filter 222*b*, and a second ADC 224*b*. Illustrative digital controller 206 can include a phase shift calculator 226, a virtual channel signal generator 227, and an output signal generator 228, described in detail below.

Sensor 200 can include a plurality of terminals/pins for connections to external circuits, devices, and/or systems. As shown, sensor 200 can include a voltage supply input terminal 240 coupled to supply regulation circuitry 210 for receiving a voltage from an external voltage supply, output terminals 242*a*, 242*b* coupled to output driver circuitry 208 for providing two or more digital outputs, and a ground terminal 244 for grounding the sensor. Supply regulation circuitry 210 can convert a supply voltage on input terminal 240 to one or more analog and/or digital supply voltages/currents to power various analog and digital elements of sensor 200. Likewise, ground terminal 224 may be connected to various sensor circuit elements. Various such connections are omitted from the figure for clarity.

Elements of sensor 202 can be provided as analog and/or digital circuit elements arranged and configured to perform the functions described in conjunction therewith. Moreover, the particular elements shown in FIG. 2 are merely illustrative and not intended to be exhaustive of all elements that may be provided within a magnetic field sensor. For example, in some cases, sensor 200 may include additional analog and/or digital circuit elements to correct for offset due to mechanical stresses, magnetic interference from nearby components or pollutants, temperature variations, etc. In some cases, temperature sensor 216 may be used for offset correction. Likewise, digital controller 206 may be programmed or otherwise configured to perform functions other than those described below for phase shift calculator 226, virtual channel signal generator 227, and output signal generator 228.

Responsive to a magnetic field, magnetic field sensing elements 202 can generate two magnetic field signals 230*a*. 230*b* with phase shift therebetween. In the case where the magnetic field is produced by a rotating ferrous gear, magnetic field signals 230*a*, 230*b* may be sinusoids. In some cases, both magnetic field signals 230*a*, 230*b* may correspond to differential signals, meaning they represent a difference (e.g., an amplified difference) between outputs of two different sensing elements 202. In one example, outputs of a first sensing element 202*a* and a second sensing element 202*b* may be subtracted or otherwise used (e.g., via a differential amplifier) to provide first differential magnetic field signals 230*a* and outputs of the second sensing element 202*b* and a third sensing element 202*c* may be subtracted or otherwise used to provide second differential magnetic field signals 230*b*.

Sensing elements 202 may be spaced apart or otherwise arranged such that the magnetic field signals 230*a*, 230*b* have a predetermined, desired phase shift. For example, within a magnetic encoder, it may be desirable for magnetic field signals 230*a*, 230*b* to have 90° phase shift (thus, signals 230*a* and 230*b* may be sometimes referred to as sine and cosine signals, respectively). The actual phase shift may be greater than or less than the desired phase shift due to, for example, misalignment of the sensing elements 202.

Magnetic field signals 230*a* and 230*b* may be processed by the first and second channels of front-end circuitry 204 to generate respective first and second digital channel signals 232*a* and 232*b* (sometimes referred to as "left" and "right" channel signals). In more detail, magnetic field signals can undergo gain adjustment via amplifiers 220*a*, 220*b*, filtering via filters 222*a*, 222*b*, and analog-to-digital conversion via ADCs 224*a*, 224*b*. Said processing can result in channel signals 232*a*, 232*b* that are also responsive to the magnetic field detections and phase-shifted (e.g., desirably by 90°). In some cases, channel signals 232*a*, 232*b* may be digital versions/representations of sinusoids.

Phase shift calculator 226 can receive channel signals 232*a*, 232*b* and calculate their phase shift. The calculated phase shift can be provided to virtual channel signal generator 227 to correct for undesirable phase shift between channel signals 232*a*, 232*b*, as discussed below.

In some embodiments, phase shift can be calculated by converting sinusoidal channel signals 232*a*, 232*b* into (digital) pulse signals each having a rising edge and a falling edge for each period of the corresponding sinusoidal signal. In some cases, a threshold-based technique can be used to generate these pulse signals. For example, when sinusoidal channel signal 232*a* has an amplitude above a first threshold, the corresponding pulse signal may have a first state ("high") and when it has an amplitude below a second threshold, the corresponding pulse signal may have a second state ("low"), with raising/falling pulse edges occurring between these state transitions. Such thresholds can be calculated, for example, based on a percentage of peak-to-peak signal amplitude (e.g., 50% of the peak-to-peak amplitude). Likewise for sinusoidal signal 232*b*.

In some embodiments, sensor 200 may provide pulse signals as output (via output signal generator 228 discussed below) and phase shift calculator 226 may use these sensor-output pulse signals to calculate phase shift between the two channels. In other embodiments, phase shift calculator 226 may directly calculate the pulse signals from channel signals 232*a*, 232*b*. In any case, phase shift calculator 226 can calculate phase shift from the two pulse signals.

In some embodiments, phase shift calculator 226 can calculate: (i) a time between a rising/falling edge of one pulse signal and a next rising/falling edge of the other pulse signal (i.e., the rising/falling edge of the other pulse signal that follows closest in time), herein denoted $T_d$; (ii) a time between two consecutive rising/falling edges of either the first or second pulse signal, herein denoted $T_p$ and effectively representing the target speed; and (iii) the channel phase shift, $\phi_{calc}$, as:

$$\phi_{calc} = \frac{T_d}{T_p} \cdot 360. \qquad (1)$$

In some cases, phase shift calculator 226 may calculate the channel phase shift, $\phi_{calc}$, from averages of $T_d$ and $T_p$ taken over multiple signal periods:

$$\phi_{calc} = \frac{avg(T_d)}{avg(T_p)} \cdot 360. \tag{2}$$

In some cases, phase shift calculator 226 may calculate the averages of $T_d$ and $T_p$ over periods when the target is rotating or otherwise moving at a constant or near constant speed. For example, it can detect constant target speed when $T_p$ is equal or nearly equal for multiple consecutive periods of either or both pulse signals. To account for jitter and target tolerances, phase shift calculator 226 may consider $T_p$ to be equal for consecutive periods if it differs by less than a threshold amount across those periods.

As previously discussed, actual phase shift between channel signals 232*a*, 232*b* may depend in significant part on spacing between sensing elements 202, target pitch, and air gap between the sensor and target. Thus, for a given system in which sensor 200 is deployed, the actual phase shift between channels may remain substantially constant over time. In some embodiments, the channel phase shift can be calculated during an initial period of system operation (i.e., during a calibration phase) and saved to EEPROM 212 for use during subsequent periods of operation without having to be re-calculated.

In some embodiments, phase shift calculator 226 can calculate $T_d$ and/or $T_p$ using a clock signal (e.g., a signal having a fixed, known frequency) that is generated by oscillator 218 and provided to digital controller 206.

Virtual channel signal generator 227 can receive the calculated channel phase shift (e.g., from EEPROM 212) along with channel signals 232*a*, 232*b* and generate one or more virtual channel signals that have a predetermined, desired phase shift with respect to at least one of the channel signals 232*a*, 232*b*. For example, if channel signals 232*a*, 232*b* have an actual phase shift of 85°, virtual channel signal generator 227 may generate a virtual channel signal that has a desired phase shift of 90° with respect to either the first or second channel signal 232*a*, 232*b*. A virtual channel signal may be generated as a digital representation of a sinusoidal signal having the same frequency as either or both of the channel signals 232*a*, 232*b*.

In some embodiments, given a desired phase shift, $\phi_{desired}$, virtual channel signal generator 227 can replace second channel signal 232*b* with a virtual channel signal, $v_2$, generated as follows:

$$v_2 = a_2 \cdot x_a + b_2 \cdot x_b \tag{3}$$

where:

$x_a$ is first channel signal 232*a*, $x_b$ is second channel signal 232*b*, $$a_2 = \cos(\phi_{desired}) - \frac{\sin\phi_{desired}}{\tan\phi_{calc}},$$

and $$b_2 = \frac{\sin(\phi_{desired})}{\sin(\phi_{calc})}.$$

In some embodiments, the predetermined, desired phase shift, $\phi_{desired}$, may be a setting programmed within EEPROM 212. In other embodiments, the desired phase shift may be hardcoded or hardwired within sensor 200.

In some embodiments virtual channel signal generator 227 can use the technique described above to generate multiple virtual channel signals each having a different desired phase shift. That is, multiple different desired phase shifts $\phi_{desired_1}$, $\phi_{desired_2}$, etc. can be used to calculate multiple virtual channels $v_1$, $v_2$, etc. The multiple desired phase shift values can be programmed within EEPROM 212 or hardcoded/hardwired within sensor 200.

Output signal generator 228 can receive channel signals 232*a*, 232*b* along with one or more virtual channel signals generated by virtual channel signal generator 227 and use some combination of these sinusoidal signals to generate digital output signals 234*a*, 234*b*. The digital output signals 234*a*, 234*b* may be provided at output terminals 242*a* and 242*b*, respectively, by way of output driver circuitry 208. In some cases, digital output signals 234*a*, 234*b* may be pulse signals each having a rising and falling edge for each period of a corresponding sinusoidal signal. Output signal generator 228 can generate the pulse signals using a threshold-based technique based on peak-to-peak signal amplitude, such as described above.

In the example of FIG. 2, two digital output signals 234*a*, 234*b* are provided, one of which may be generated from first channel signal 232*a* and the other of which may be generated from a virtual channel signal generated by virtual channel signal generator 227 (e.g., signal $v_2$ described above). That is, output signal generator 228 can selectively replace the second channel signal 232*b* with a phase-corrected virtual channel signal such that two digital output signals 234*a*, 234*b* have a desired phase shift.

Digital output signals 234*a*, 234*b* can be provided to additional circuitry (not shown) to calculate, for example, an angle of rotation of a target (e.g., a ferrous gear). In more detail, given two pulse signals with 90° phase shift, target angle can be determined using an ARCTAN calculation, such as implemented by a CORDIC. In some cases, such angle calculation may be implemented directly by digital controller 206 of sensor 200.

In some embodiments, a magnetic field sensor may have N>2 more outputs, which may be useful for high-resolution applications (e.g., a high-resolution magnetic encoder utilizing three or more digital signals). In this case, output signal generator 228 can generate a first digital output signal based on first channel signal 232*a* and can generate N−1 other output signals based on N−1 different virtual channel signals generated by virtual channel signal generator 227, each having a different desired phase shift relative to first channel signal 232*a*.

While embodiments of the present disclosure are described in the context of magnetic field sensors, the structures and techniques sought to be protected herein are not limited to use in magnetic field sensors. For example, disclosed phase correction structures and techniques can be applied in various types of systems and devices where it is desirable to have two or more signals with particular phase shift therebetween (e.g., orthogonal signals).

Structure and techniques disclosed herein can also be used for sensors in crank applications, where the mechanical switching location of the output is important. The switching location can be adjusted by calculating a virtual channel signal using the method above and switching on this shifted channel to adjust the switching location.

Figure 3:
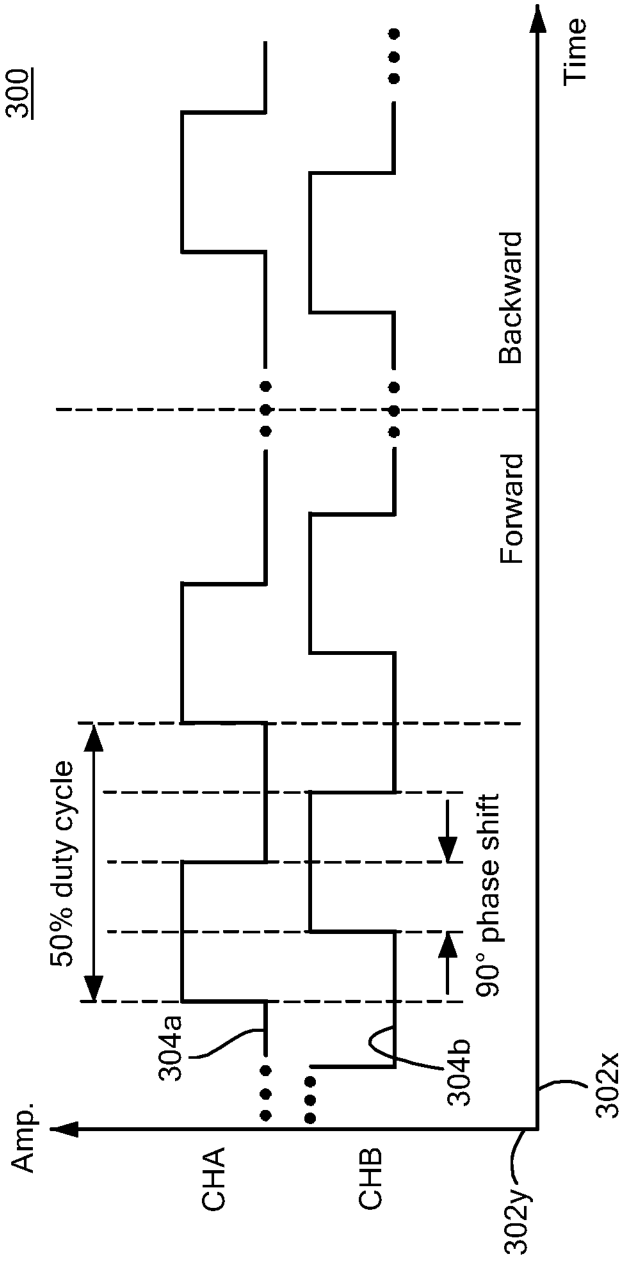
FIG. 3 is a graphical diagram showing signals with desirable phase shift for detecting target position information in a two-channel magnetic encoder.

Turning to FIG. 3, graph 300 includes horizontal axis 302*x* representing time and a vertical axis 302*y* representing amplitude (e.g., voltage or current). Waveforms 304*a*, 304*b* correspond to two different pulse signals that can be output by a magnetic field sensor, such as the two-channel sensor 200 of FIG. 2. That is, waveforms 304*a*, 304*b* may correspond to digital output signals 234*a*, 234*b* in FIG. 2. As illustrated, the pulse signals are phase shifted by 90° and have a 50% duty cycle. Thus, FIG. 3 shows an example of desirable or "ideal" output of a two-channel sensor for detecting position information of a target (e.g., detecting angle of a ferrous gear).

Figure 4:
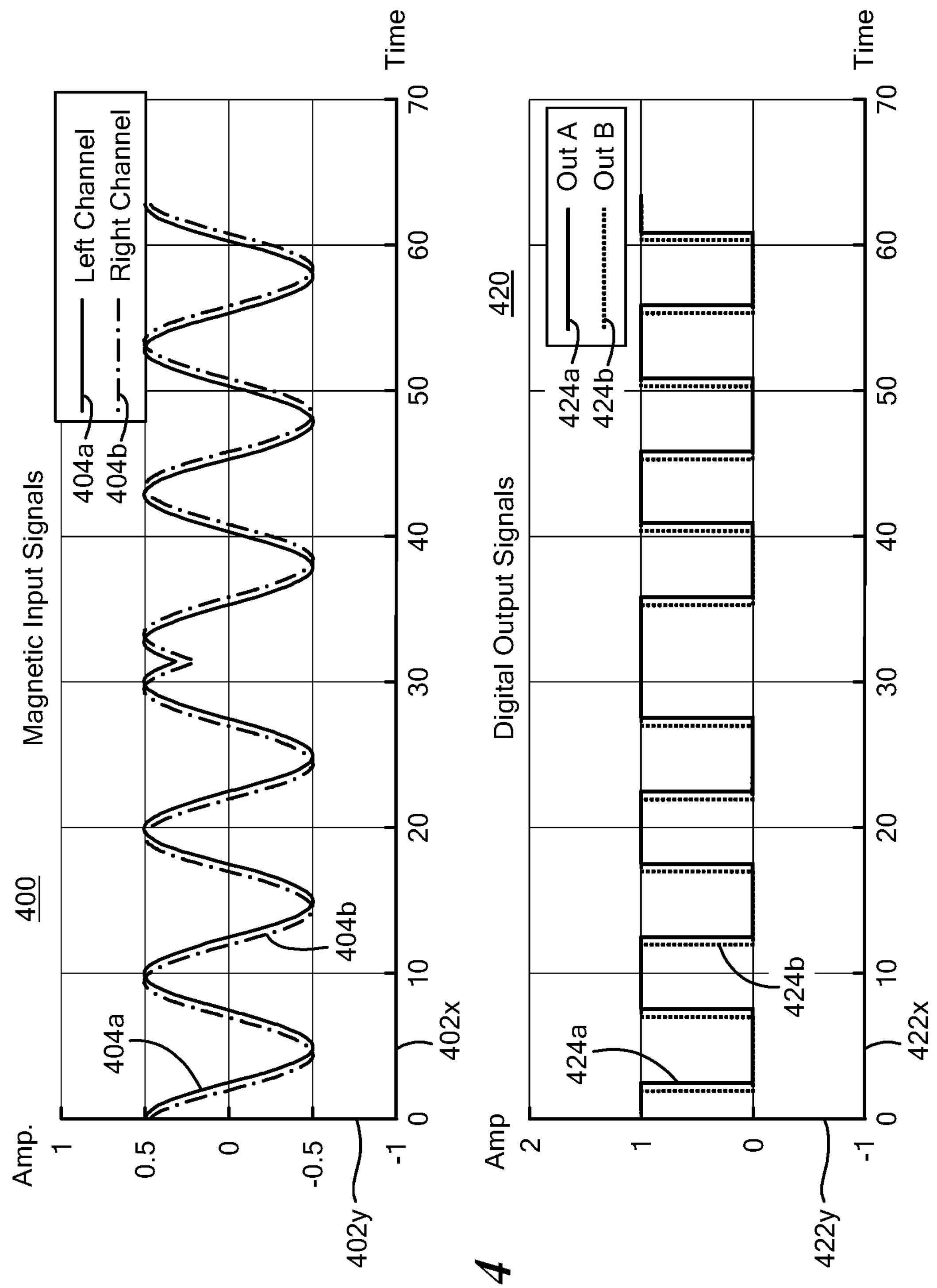
FIG. 4 is a graphical diagram showing signals with undesirable phase shift for detecting target position information in a two-channel magnetic encoder.

In contrast, FIG. 4 shows an example of undesirable phase shift for detecting target position information in a two-channel magnetic encoder. A first graph 400, having a horizontal axis 402*x* representing time and a vertical axis 402*y* representing amplitude, includes waveforms 404*a*, 404*b* corresponding to the two sinusoidal channel signals (e.g., signals 232*a*, 232*b* in FIG. 2). As shown, the waveforms 404*a*, 404*b* have a phase shift significantly less than 90° (more specifically, they are almost in phase). A second graph 420, having a horizontal axis 422*x* representing time and a vertical axis 422*y* representing amplitude, shows pulse signal waveforms 424*a* and 424*b* that may be generated from channel sinusoidal waveforms 404*a* and 404*b*, respectively. That is, waveforms 424*a*, 424*b* may correspond to digital output signals 234*a*, 234*b* in FIG. 2. In this example, the pulse signals may be generated using a threshold-based technique with a threshold set to 50% of peak-to-peak signal amplitude. As can be seen, the resulting digital signals have an undesirable phase shift 18° between the two-channel digital output signals.

Figure 5:
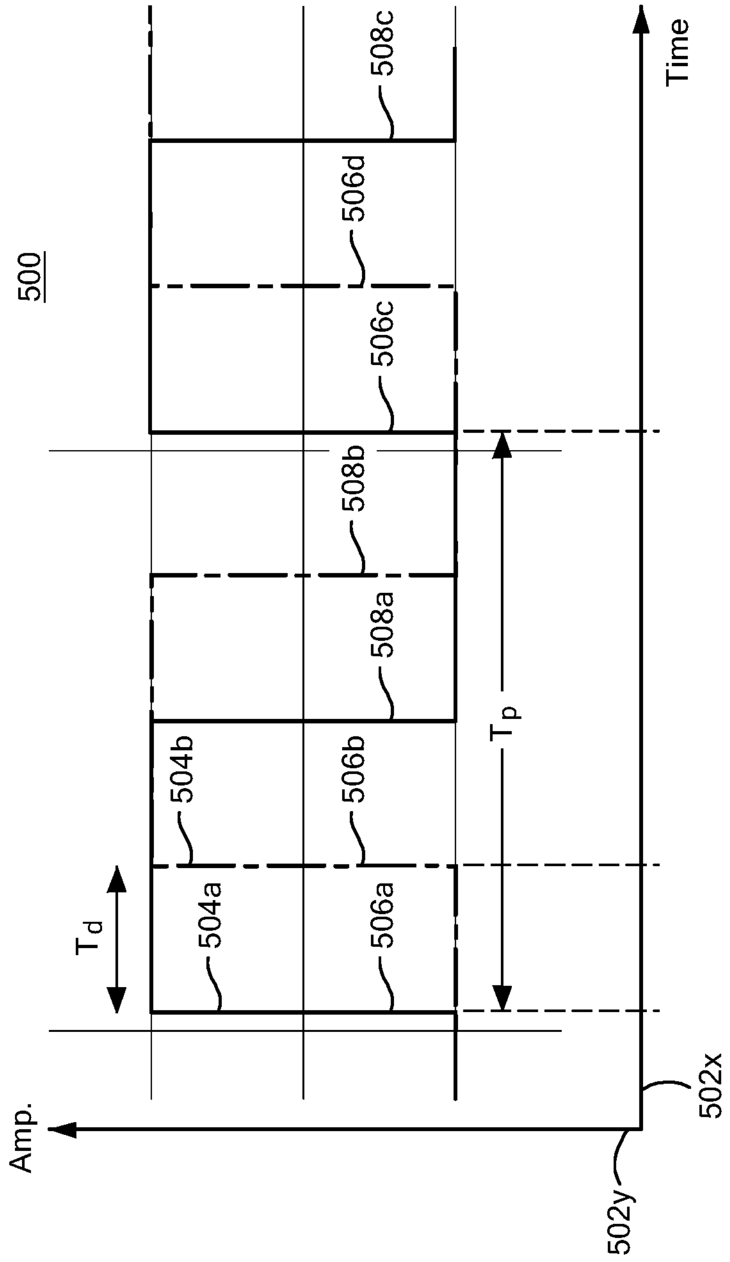
FIGS. 5 and 6 are graphical diagrams illustrating a technique for generating a phase-corrected signal (or "virtual channel signal") for use in detecting target position information, according to some embodiments.
Figure 6:
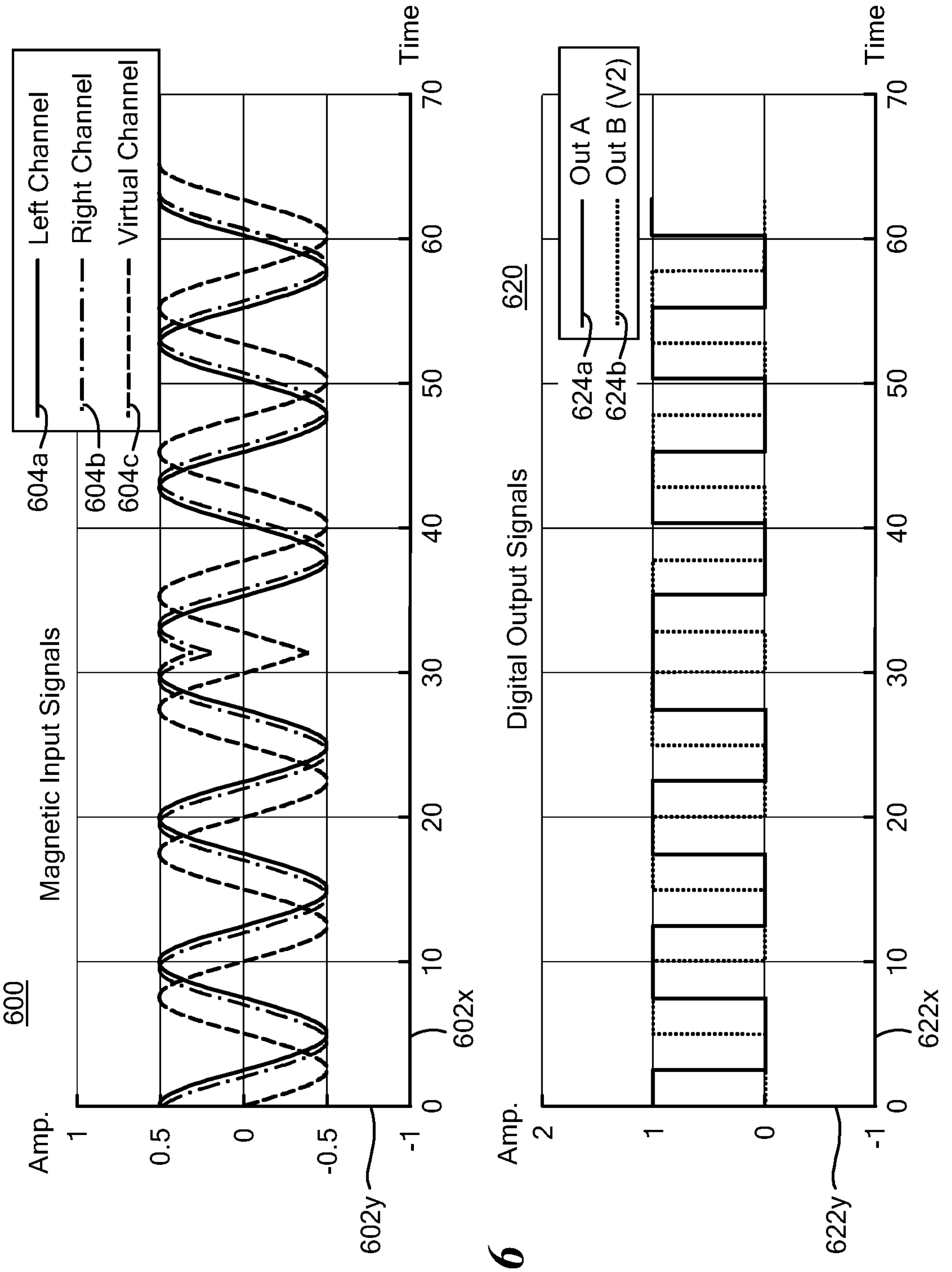

FIGS. 5 and 6 illustrate how such undesirable phase shift can be automatically corrected for using disclosed structures and techniques.

Referring to FIG. 5, a graph 500, having horizontal axis 502*x* representing time and vertical axis 502*y* representing amplitude, includes waveforms 504*a* and 504*b* corresponding to a first and second digital outputs (pulse signals), respectively, of a two-channel sensor. First waveform 504*a* has rising edges 506*a*, 506*c* and falling edges 508*a*, 508*c*. Second waveform 504*b* has rising edges 506*b*, 506*d* and falling edge 508*b*. $T_d$ can be calculated as the time between first rising edge 506*a* of first waveform 504*a* and first rising edge 506*b* of second waveform 506*b*. $T_p$ can be calculated as the time between first rising edge 506*a* of first waveform 504*a* and second rising edge 506*c* of first waveform 504*a*. A phase shift between the pulse signals, $\phi_{calc}$, can then be calculated using equation (1) or (2). In some cases, the calculated phase shift can be stored in EEPROM.

Referring to FIG. 6, the calculated phase shift, which may be stored in EEPROM, can subsequently be used to generate one or more virtual (phase-corrected) channels signals using.

A graph 600, having horizontal axis 602*x* representing time and vertical axis 602*y* representing amplitude, includes waveforms 604*a* and 604*b* corresponding to a first and second (or "left" and "right") sinusoidal channel signals received by a two-channel sensor. Using the calculated phase shift, $\phi_{calc}$, and a given desired phase shift, $\phi_{desired}$, a virtual channel signal can be generated using equation (3), resulting in waveform 604*c*. In this example, the virtual channel signal is orthogonal to the first channel signal represented by waveform 604*a* (i.e., $\phi_{desired}$=90°).

As shown in graph 620, having horizontal axis 622*x* representing time and vertical axis 622*y* representing amplitude, the first channel waveform 604*a* and the (generated) virtual channel waveform 604*c* be converted to waveforms 624*a* and 624*c*, respectively, corresponding to digital outputs of a two-channel sensor. Thus, desirable magnetic field sensor outputs can be achieved independent of target design, magnetic field sensing element spacing, etc.

Figure 7:
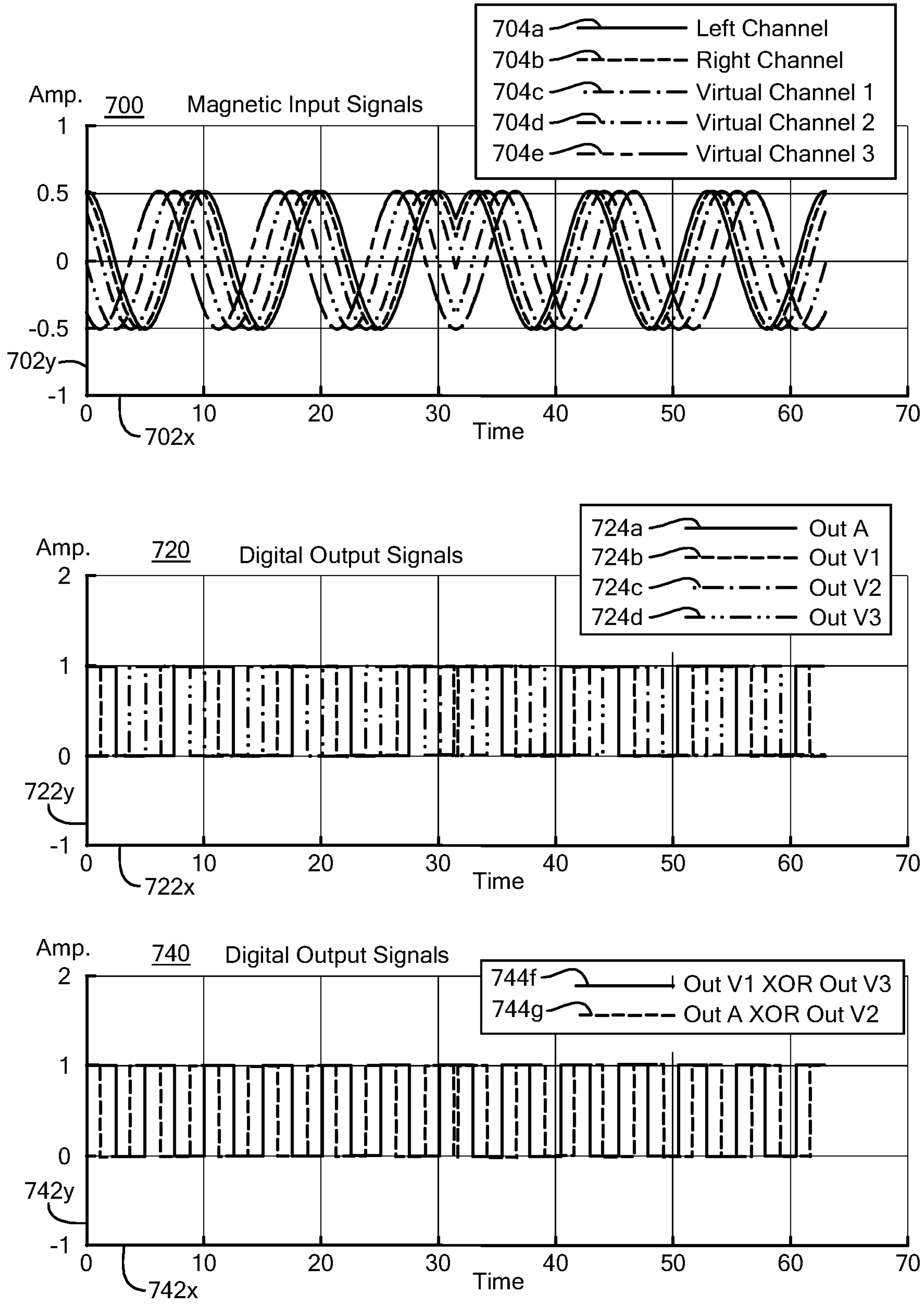
FIG. 7 is a graphical diagram illustrating a technique for generating multiple virtual channel signals for high resolution target position detection in a magnetic encoder, according to some embodiments.

FIG. 7 illustrates how multiple virtual channel signals be generated in a two-channel magnetic field sensor using a single calculated phase shift, $\phi_{calc}$, and multiple desired phase shift values, $\phi_{desired_1}$, $\phi_{desired_2}$, etc. In this example, it is assumed that $\phi_{calc}$=18° and three different virtual channel signals are desired, with $\phi_{desired_1}$=45°, $\phi_{desired_2}$=90°, and $\phi_{desired_3}$=135°.

Graph 700, having horizontal axis 702*x* representing time and vertical axis 702*y* representing amplitude, includes waveforms 704*a*, 704*b* corresponding to sinusoidal channel signals received in a two-channel magnetic field sensor. Having calculated the phase shift between the two channels, $\phi_{calc}$, three virtual channels 704*c*, 704*d*, and 704*e* can be generated using equation (3) with respective desired phase shifts of 45°, 90°, and 135°.

Graph 720, having horizontal axis 722*x* representing time and vertical axis 722*y* representing amplitude, includes waveforms 724*a*, 724*c*, 724*d*, and 724*d* corresponding to sensor digital outputs (pulse signals) generated from waveforms 704*a*, 704*c*, 704*d*, and 704*c*, respectively.

Thus is it shown how embodiments of the present disclosure can provide for N-channel (N>2) sensor outputs using a conventional two-channel arrangement of magnetic field sensing elements to enable high-resolution applications.

Graph 740 illustrates how two or more sensor digital outputs can be combined (XOR). XOR'ing two outputs can be used to provide one output with twice the resolution (edges/time). It is useful in applications that require resolving smaller angles with higher resolution. In this example, where horizontal axis 742*x* represents time and vertical axis 742*y* represents amplitude, a first waveform 744*f* may correspond to the XOR or waveforms 724*c* and 724*c* and a second waveform 744*g* may correspond to the XOR or waveforms 724*a* and 724*d*. These particular combinations of signals are merely illustrative and various other combinations could be formed, including combinations of three or more signals.

Figure 8:
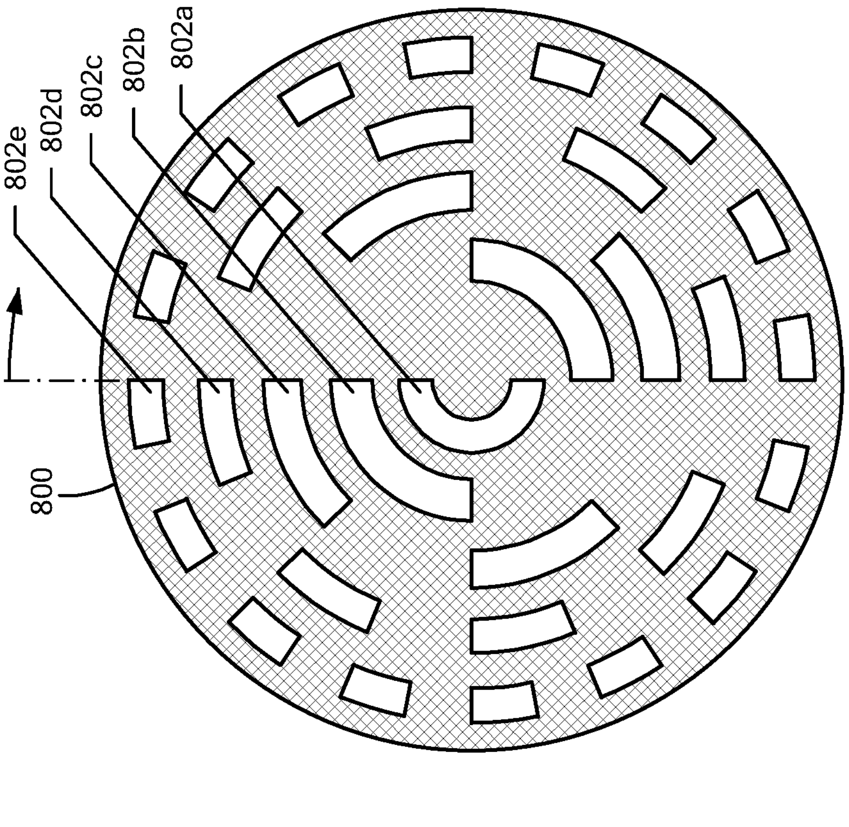
FIG. 8 is a front view of a multiple ring encoder target for which resolution can by increased by generating virtual channel signals, according to some embodiments.

Turning to FIG. 8, disclosure structures and techniques can be applied to increase the resolution of multiple-ring absolute encoders without changing size of the encoder disk, according to some embodiments. An illustrative multiple-ring encoder disk 800 includes five rings 802*a*, 802*b*, 802*c*, 802*d*, and 802*e* arranged so as enable a magnetic field sensor to produce a 5-bit digital output representing an angle or rotation of the disk 800. For example, when the disk 800 is rotated 0°, a sensor may output the 5-bit value 00000; when the disk 800 is at 11.25°, the sensor may output the 5-bit value 00001, and so on as indicated by table 804. The 5-bit sensor output may be encoded using pulse-width modulation (PWM), amplitude modulation (AM), or any other format suitable for the encoder application.

A magnetic field sensor with phase correction, such as sensor 200 of FIG. 2, may be used to generate one or more additional bits of resolution 802*f*. 802*g*, etc. For example, the magnetic field sensor can be configured to detect a magnetic field produced by ring 802*e* during rotation of disk 800. One or more virtual signals can then be generated using the structures and techniques disclosed herein, e.g., by generator 227 of FIG. 2 using equation (3)).

Figure 9:
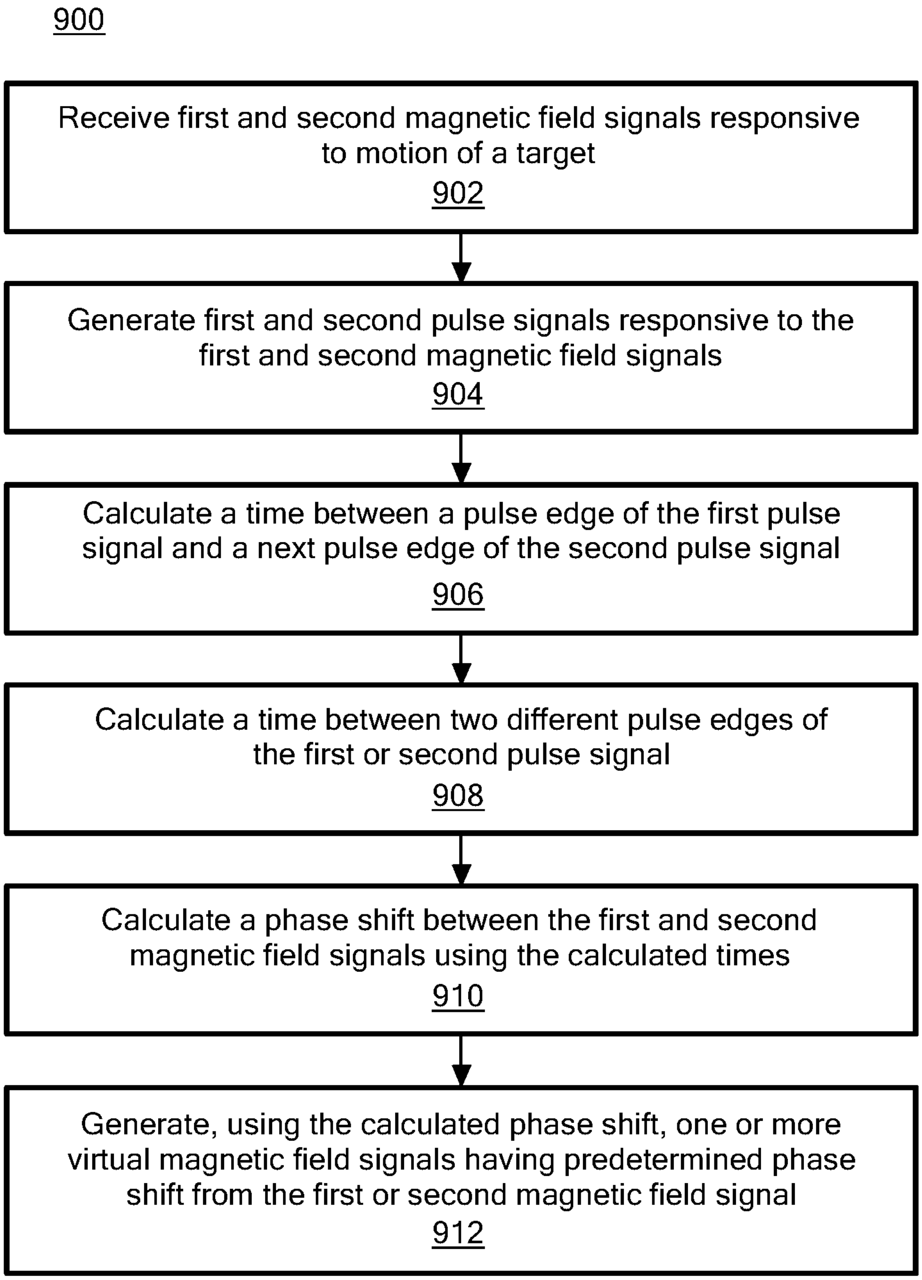
FIG. 9 is flow diagram showing an illustrative method for generating virtual channel signals in a magnetic encoder, according to some embodiments.

FIG. 9 shows an example of a process 900 for generating virtual channel signals in a magnetic encoder, according to some embodiments. Illustrative process 900 may be implemented, for example, within sensor 200 of FIG. 2 and more particularly within digital controller 206.

At block 902, first and second magnetic field signals can be received. The signals may be responsive to motion of a target (e.g., rotation of a ferrous gear). In some embodiments, the magnetic field signals (or "channel signals") may be digital versions/representations of sinusoids.

At block 904, first and second pulse signals can be generated responsive to the first and second magnetic field signals. In some embodiments, the pulse signals can be generated using a threshold-based technique such as described above.

At block 906, a time ($T_d$) can be calculated between a rising/falling edge of one pulse signal and a next rising/falling edge of the other pulse signal.

At block 908, a time ($T_p$) can be calculated between two consecutive rising/falling edges of either the first or second pulse signal.

At block 910, a phase shift ($\phi_{calc}$) can be calculated between the first and second magnetic field signals using the times calculated at blocks 906 and 906. In some cases, the phase shift may be calculated based on averages of $T_d$ and $T_p$ taken over periods when the target is rotating or otherwise moving at a constant or near constant speed. For example, constant target speed can be detected when $T_p$ is equal or nearly equal for multiple consecutive periods of either or both pulse signals. In some embodiments, the phase shift can be can then be calculated using equation (1) or (2) from above.

At block 912, the calculated phase shift may be used to generate one or more virtual magnetic field signals (or "channel signals") having predetermined phase shifts (desired) from the first or second magnetic field signal. In some embodiments, equation (3) from above may be used to generate the virtual magnetic field signal(s). In some embodiments, the virtual magnetic field signals can be converted to pulse signals and provided on outputs of the sensor.

In some embodiments, the calculated phase shift may be stored to a memory of the sensor (e.g., an EEPROM) during a first period of operation and subsequently retrieved for use in generating the virtual magnetic field signals during subsequent periods of operation. In some embodiments, the predetermined phase shifts may also be stored in memory and used for generating the virtual magnetic field signals.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A method comprising:

receiving, by a magnetic field sensor, first and second magnetic field signals responsive to motion of a target, wherein the target comprises a multiple ring absolute encoder configured to provide a number of bits of resolution associated with the motion of the target;

generating first and second digital pulse signals responsive to the first and second magnetic field signals, respectively;

calculating a first time between a pulse edge of the first digital pulse signal and a next pulse edge of the second digital pulse signal;

calculating a second time between two different pulse edges of the first digital pulse signal or two different pulse edges of the second digital pulse signal;

detecting the motion of the target to be at constant motion;

in response to detecting the constant motion, calculating, using the calculated first and second times, a calculated phase shift between the first and second magnetic field signals; and generating, using the calculated phase shift, a third magnetic field signal having a predetermined phase shift from the first magnetic field signal or from the second magnetic field signal, wherein generating the third magnetic field signal includes:

multiplying the first magnetic field signal by a first coefficient;

multiplying the second magnetic field signal by a second coefficient; and summing the multiplied first magnetic field signal and the multiplied second magnetic field signal to generate the third magnetic field signal, wherein the third magnetic field signal provides one or more bits of resolution associated with the motion of the target in addition to the number of bits of resolution provided by the multiple ring absolute encoder.

2. The method of claim 1 wherein the calculating of the first time includes calculating a time between a rising pulse edge of the first digital pulse signal and a next rising pulse edge of the second digital pulse signal.

3. The method of claim 1 wherein the calculating of the second time includes calculating a time between consecutive rising pulse edges of the first digital pulse signal or consecutive rising pulse edges of the second digital pulse signal.

4. The method of claim 1 wherein the calculating of the calculated phase shift includes dividing the first time by the second time.

5. The method of claim 1 further comprising:

generating a third digital pulse signal responsive to the third magnetic field signal.

6. The method of claim 5 further comprising:

providing the first digital pulse signal on a first output of the sensor; and selectively providing either the second or third digital pulse signal on a second output of the sensor.

7. The method of claim 1 further comprising:

storing, during a first period of operation, the calculated phase shift to a memory of the magnetic field sensor;

retrieving, during a second period of operation, the calculated phase shift from the memory; and using the calculated phase shift retrieved from the memory to generate the third magnetic field signal.

8. The method of claim 1 wherein the predetermined phase shift is ninety degrees.

9. The method of claim 1 wherein the first magnetic field signal is generated by at least one or more magnetic field sensing elements of the magnetic field sensor and the second magnetic field signal is generated by at least one or more other magnetic field sensing elements of the magnetic field sensor.

10. The method of claim 9 wherein the one or more magnetic field sensing elements comprise Hall effect elements.

11. The method of claim 1 further comprising:

generating, using the calculated phase shift, one or more other magnetic field signals having respective other predetermine phase shifts from the first magnetic field signal.

12. The method of claim 1 wherein:

the first coefficient corresponds to a difference involving the predetermined phase shift and a ratio involving the predetermined phase shift and the calculated phase shift; and the second coefficient corresponds to a ratio involving the predetermined phase shift and the calculated phase shift.

13. The method of claim 1 wherein the multiple ring absolute encoder includes a plurality of rings arranged on a disk, wherein the number of bits of resolution provided by the multiple-ring multiple ring absolute encoder is determined by the number of rings in the plurality.

14. A magnetic field sensor comprising:

a plurality of magnetic field sensing elements configured to generate first and second magnetic field signals responsive to motion of a target, wherein the target comprises a multiple ring absolute encoder configured to provide a number of bits of resolution associated with the motion of the target; and circuitry configured to:

generate first and second digital pulse signals responsive to the first and second magnetic field signals, respectively;

calculate a first time between a pulse edge of the first digital pulse signal and a next pulse edge of the second digital pulse signal;

calculate a second time between two different pulse edges of the first digital pulse signal or two different pulse edges of the second digital pulse signal;

detect the motion of the target to be at constant motion;

in response to the detection of the constant motion, calculate, using the calculated first and second times, a calculated phase shift between the first and second magnetic field signals; and generate, using the calculated phase shift, a third magnetic field signal having a predetermined phase shift from the first magnetic field signal or from the second magnetic field signal, wherein generating the third magnetic field signal includes:

multiplying the first magnetic field signal by a first coefficient;

multiplying the second magnetic field signal by a second coefficient; and summing the multiplied first magnetic field signal and the multiplied second magnetic field signal to generate the third magnetic field signal, wherein the third magnetic field signal provides one or more bits of resolution associated with the motion of the target in addition to the number of bits of resolution provided by the multiple ring absolute encoder.

15. The magnetic field sensor of claim 14 wherein the circuitry is configured to calculate the first time by calculating a time between a rising pulse edge of the first digital pulse signal and a next rising pulse edge of the second digital pulse signal.

16. The magnetic field sensor of claim 14 wherein the circuitry is configured to calculate the second time by calculating a time between consecutive rising pulse edges of the first digital pulse signal or consecutive rising pulse edges of the second digital pulse signal.

17. The magnetic field sensor of claim 14 wherein the circuitry is configured to calculate the calculated phase shift by dividing the first time by the second time.

18. The magnetic field sensor of claim 14 wherein the circuitry is further configured to:

generate a third digital pulse signal responsive to the third magnetic field signal.

19. The magnetic field sensor of claim 18 wherein the circuitry is further configured to:

provide the first digital pulse signal on a first output of the sensor; and selectively provide either the second or third digital pulse signal on a second output of the sensor.

20. The magnetic field sensor of claim 14 further comprising a memory, wherein the circuitry is further configured to:

store, during a first period of operation, the calculated phase shift to the memory;

retrieve, during a second period of operation, the calculated phase shift from the memory; and use the calculated phase shift retrieved from the memory to generate the third magnetic field signal.

21. The magnetic field sensor of claim 14 wherein the predetermined phase shift is ninety degrees.

22. The magnetic field sensor of claim 14 wherein the plurality of magnetic field sensing elements comprise Hall effect elements.

23. The magnetic field sensor of claim 14 wherein the circuitry is further configured to:

generate, using the calculated phase shift, one or more other magnetic field signals having respective other predetermine phase shifts from the first magnetic field signal.

24. The magnetic field sensor of claim 14 wherein the multiple-ring multiple ring absolute encoder includes a plurality of rings arranged on a disk, wherein the number of bits of resolution provided by the multiple ring absolute encoder is determined by the number of rings in the plurality.

* * * * *